(12) United States Patent
Seok et al.

(10) Patent No.: US 10,058,952 B2
(45) Date of Patent: Aug. 28, 2018

(54) BONDING STAGE AND BONDING APPARATUS COMPRISING THE SAME

(71) Applicant: Samsung Electronics Co., Ltd., Suwon-si, Gyeonggi-do (KR)

(72) Inventors: Seung-Dae Seok, Yongin-si (KR); Sang Yoon Kim, Hwaseong-si (KR); Hui Jae Kim, Seoul (KR); Jae Bong Shin, Gunpo-si (KR); Byung Joon Lee, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 66 days.

(21) Appl. No.: 15/340,303

(22) Filed: Nov. 1, 2016

(65) Prior Publication Data
US 2017/0136570 A1 May 18, 2017

(30) Foreign Application Priority Data
Nov. 18, 2015 (KR) .................. 10-2015-0161540

(51) Int. Cl.
*B23K 37/00* (2006.01)
*B23K 20/02* (2006.01)
(Continued)

(52) U.S. Cl.
CPC ............ *B23K 20/026* (2013.01); *B23K 3/085* (2013.01); *B23K 20/004* (2013.01); *B23K 20/26* (2013.01); *B23K 37/003* (2013.01); *H01L 24/75* (2013.01); *H01L 2224/7598* (2013.01); *H01L 2224/75251* (2013.01); *H01L 2224/75501* (2013.01); *H01L 2224/75988* (2013.01)

(58) Field of Classification Search
CPC .... B23K 20/026; B23K 20/004; B23K 20/26; H01L 24/75; H01L 2224/75988; H01L 2224/7598; H01L 2224/75251; H01L 2224/75501
See application file for complete search history.

(56) References Cited

U.S. PATENT DOCUMENTS 5,435,378 A * 7/1995 Heine .................. B23K 3/047
165/168
6,863,109 B2 3/2005 Kim et al.
(Continued)

FOREIGN PATENT DOCUMENTS

JP 06053261 A * 2/1994
JP 3625186 B2 12/2004
(Continued)

*Primary Examiner* — Kiley Stoner
(74) *Attorney, Agent, or Firm* — Myers Bigel, P.A.

(57) ABSTRACT

A bonding stage is provided. The bonding stage includes a first heater disposed under a first region of a substrate having a plurality of semiconductor chips disposed thereon, a second heater disposed under a second region different from the first region of the substrate, a cooler disposed under the first heater and the second heater and blocking heat of the first heater and heat of the second heater from being transferred to lower portions of the first heater and the second heater, and a thin plate disposed on the first heater and the second heater to support the substrate and transferring the heat of the first heater and the heat of the second heater to the substrate, wherein the first heater and the second heater are independently operated.

16 Claims, 12 Drawing Sheets

(51) Int. Cl.
  *H01L 23/00* (2006.01)
  *B23K 20/00* (2006.01)
  *B23K 20/26* (2006.01)
  *B23K 3/08* (2006.01)

(56) References Cited

U.S. PATENT DOCUMENTS

| | | | |
|---|---|---|---|
| 7,074,646 B2 | 7/2006 | Kim et al. | |
| 8,381,966 B2 | 2/2013 | Kumar et al. | |
| 8,881,966 B2 | 11/2014 | Misumi et al. | |
| 8,888,360 B2 | 11/2014 | Gurary et al. | |
| 9,089,007 B2 | 7/2015 | Yang et al. | |
| 9,200,965 B2 | 12/2015 | Gurary et al. | |
| 9,620,476 B2 * | 4/2017 | Lee | H01L 24/75 |
| 2002/0003137 A1 * | 1/2002 | Yokoyama | B23K 3/0471 219/243 |
| 2004/0022037 A1 * | 2/2004 | Higashi | H05K 13/04 361/760 |
| 2004/0079464 A1 * | 4/2004 | Kumakura | H01L 21/563 156/60 |
| 2005/0034302 A1 * | 2/2005 | Hosotani | B23K 3/087 29/840 |
| 2007/0093079 A1 * | 4/2007 | Aruga | B82Y 10/00 438/800 |
| 2009/0184152 A1 * | 7/2009 | Kimbara | B23K 1/0016 228/111 |
| 2009/0314762 A1 | 12/2009 | Cui et al. | |
| 2010/0176182 A1 * | 7/2010 | Hanlon | B23K 20/1245 228/2.1 |
| 2012/0091186 A1 * | 4/2012 | Akiyama | H01L 21/67092 228/44.3 |
| 2012/0091187 A1 * | 4/2012 | Akiyama | H01L 21/67092 228/221 |
| 2013/0220989 A1 * | 8/2013 | Pease | H01L 21/67103 219/458.1 |
| 2013/0291378 A1 * | 11/2013 | Higashizawa | H05K 13/04 29/832 |
| 2013/0292455 A1 * | 11/2013 | Brofman | B23K 31/02 228/219 |
| 2014/0048529 A1 * | 2/2014 | Pease | H05B 1/0202 219/494 |
| 2014/0151879 A1 | 6/2014 | Indyk et al. | |
| 2015/0008254 A1 * | 1/2015 | Wasserman | B23K 3/085 228/180.1 |
| 2015/0171048 A1 | 6/2015 | Yasuyoshi et al. | |
| 2015/0366048 A1 * | 12/2015 | Nagase | H01L 23/3735 174/252 |
| 2015/0366079 A1 * | 12/2015 | Matsuda | B23K 1/008 219/72 |
| 2016/0041037 A1 | 2/2016 | Gurary et al. | |
| 2017/0028494 A1 * | 2/2017 | Usenbenz | B23K 1/0053 |
| 2017/0203377 A1 * | 7/2017 | Yokoyama | B23K 1/002 |

FOREIGN PATENT DOCUMENTS

| | | | | |
|---|---|---|---|---|
| JP | 2005045168 A | * | 2/2005 | B82Y 10/00 |
| JP | 2007-258483 A | | 10/2007 | |
| JP | 4879060 B2 | | 12/2011 | |
| JP | 5717614 B2 | | 3/2015 | |
| KR | 10-0484088 B1 | | 4/2005 | |
| KR | 10-0512260 B1 | | 8/2005 | |
| KR | 10-0605482 B1 | | 7/2006 | |
| KR | 10-2007-0007643 A | | 1/2007 | |
| KR | 10-0828658 B1 | | 5/2008 | |
| KR | 10-2009-0052837 A | | 5/2009 | |
| KR | 10-2012-0040368 A | | 4/2012 | |
| KR | 10-1228572 B1 | | 1/2013 | |
| KR | 10-2013-0050321 A | | 5/2013 | |
| KR | 10-2014-0006858 A | | 1/2014 | |
| KR | 10-2014-0051431 A | | 4/2014 | |
| KR | 10-2014-0103246 A | | 8/2014 | |
| KR | 10-2015-0013637 A | | 2/2015 | |
| KR | 10-2015-0023062 A | | 3/2015 | |
| WO | WO 2012/092127 A1 | | 7/2012 | |
| WO | WO 2013/025852 A1 | | 2/2013 | |
| WO | WO 2013/162697 A1 | | 10/2013 | |
| WO | WO 2014/004285 A1 | | 1/2014 | |

* cited by examiner

BONDING STAGE AND BONDING APPARATUS COMPRISING THE SAME

CROSS-REFERENCE TO RELATED APPLICATION

This application claims priority from Korean Patent Application No. 10-2015-0161540 filed on Nov. 18, 2015 in the Korean Intellectual Property Office, and all the benefits accruing therefrom under 35 U.S.C. 119, the content of which is hereby incorporated herein by reference in its entirety.

FIELD

Exemplary embodiments of the present inventive concept relate to a bonding stage and a bonding apparatus comprising the same.

BACKGROUND

In general, a bonding apparatus is an apparatus for bonding semiconductor chips formed on a wafer on a printed circuit board. A general discrete chip resistor or a general discrete chip capacitor is typically mounted on a surface of the printed circuit board. In recent years, however, an embedded package, in which active components including a memory, an application processor and so on are incorporated into the printed circuit board, has been developed.

Various components are mounted within the embedded package, so that interconnections between the components can be shortened, thereby obtaining secured reliability and improving electrical properties. In addition, since a module for the embedded package can be constructed in a smaller board area than an external printed circuit board, it can be advantageously applied to a variety of portable electronic devices and can be advantageously used for many purposes, including for considerably reducing the size of a semiconductor package and for preventing semiconductor chips from being damaged.

SUMMARY

Exemplary embodiments of the present inventive concept provide a bonding stage for preventing a bonding material from being pre-cured in a bonding process of a semiconductor chip.

Exemplary embodiments of the present inventive concept also provide a bonding apparatus for preventing a bonding material from being pre-cured in a bonding process of a semiconductor chip.

Exemplary embodiments of the present inventive concept also provide a bonding apparatus for preventing a defect appearance of a semiconductor chip from occurring in a bonding process of the semiconductor chip.

These and other objects of the present inventive concept will be described in or be apparent from the following description of embodiments.

According to an exemplary embodiment of the present inventive concept, there is provided a bonding stage including a first heater disposed under a first region of a substrate having a plurality of semiconductor chips disposed thereon, a second heater disposed under a second region different from the first region of the substrate, a cooler disposed under the first heater and the second heater and blocking heat of the first heater and heat of the second heater from being transferred to lower portions of the first heater and the second heater, and a thin plate disposed on the first heater and the second heater to support the substrate and transferring the heat of the first heater and the heat of the second heater to the substrate, wherein the first heater and the second heater are independently operated.

According to an exemplary embodiment of the present inventive concept, there is provided a bonding apparatus including a bonding head disposed on a plurality of semiconductor chips, moving on a substrate having the plurality of semiconductor chips disposed thereon and applying a pressure and heat to the plurality of semiconductor chips, a first heater disposed under a first region of the substrate, a second heater disposed under a second region different from the first region of the substrate, a cooler disposed under the first heater and the second heater and blocking heat of the first heater and heat of the second heater from being transferred to lower portions of the first heater and the second heater, a heater cooler disposed between the first and second heaters and the cooler and cooling the first heater and the second heater, and a thin plate disposed on the first heater and the second heater to support the substrate and transferring the heat of the first heater and the heat of the second heater to the substrate.

BRIEF DESCRIPTION OF THE DRAWINGS

The above and other features and advantages of the present inventive concept will become more apparent by describing in detail embodiments thereof with reference to the attached drawings in which.

DETAILED DESCRIPTION OF THE EMBODIMENTS

Figure 1:
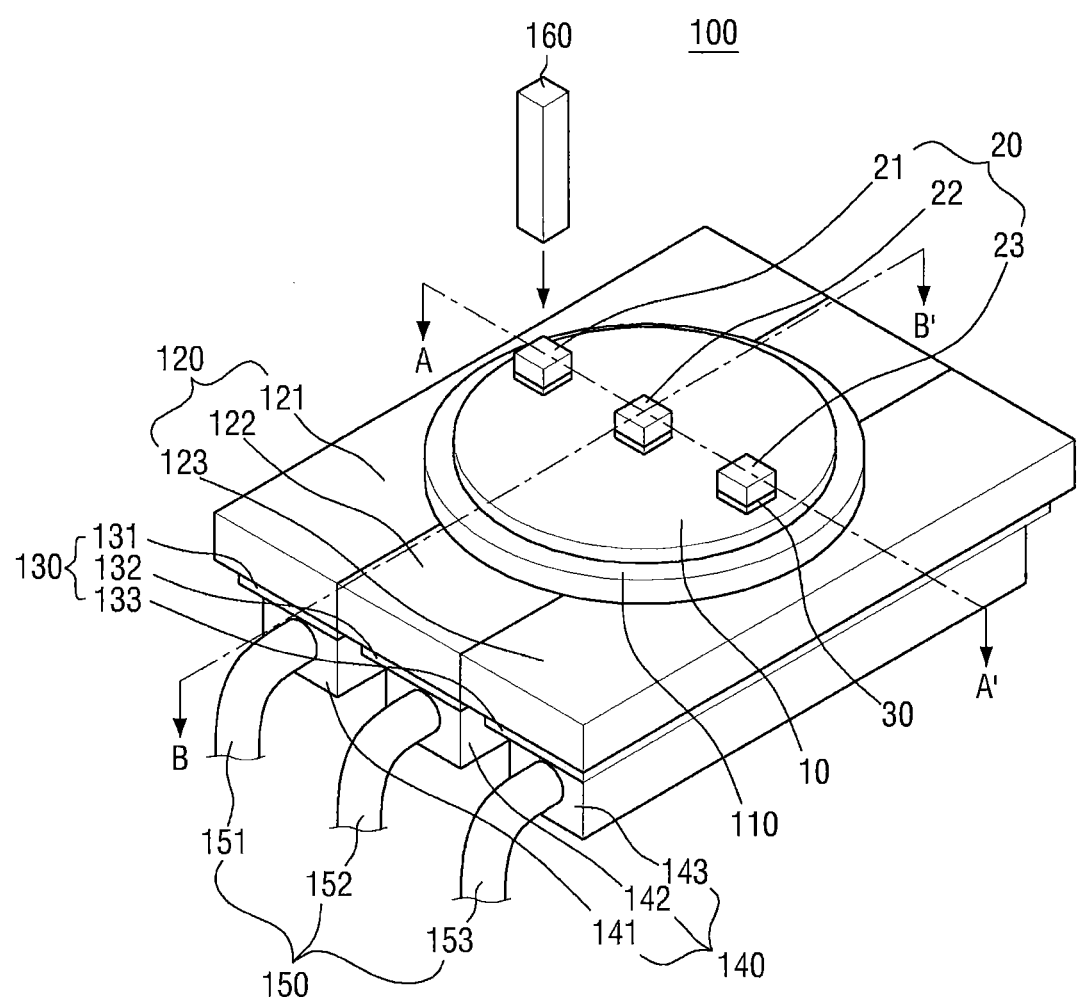
FIG. 1 is a perspective view of a bonding apparatus according to an embodiment of the present inventive concept.

Exemplary embodiments of the present concept will be described more fully hereinafter with reference to the accompanying drawings. In the drawings, the size and relative sizes of layers and regions may be exaggerated for clarity. Like reference numerals may refer to like elements throughout the accompanying drawings.

It will be understood that when an element or layer is referred to as being "on," "connected to", or "covered by" another element or layer, it can be directly on, connected to, or covered by the other element or layer or intervening elements or layers may be present. In addition, it will also be understood that when an element or layer is referred to as being "between" two elements or layers, it can be the only element or layer between the two elements or layers, or one or more intervening elements or layers may also be present. As used herein, the term "and/or" includes any and all combinations of one or more of the associated listed items. Further, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present concept.

The present concept will be described with reference to perspective views, cross-sectional views, and/or plan views, in which exemplary embodiments of the concept are shown. Thus, the profile of an exemplary view may be modified according to manufacturing techniques and/or allowances. That is, the exemplary embodiments of the concept are not intended to limit the scope of the present concept but cover all changes and modifications that can be caused due to a change in manufacturing process. Thus, regions shown in the drawings are illustrated in schematic form and the shapes of the regions are presented simply by way of illustration and not as a limitation.

Figure 2:
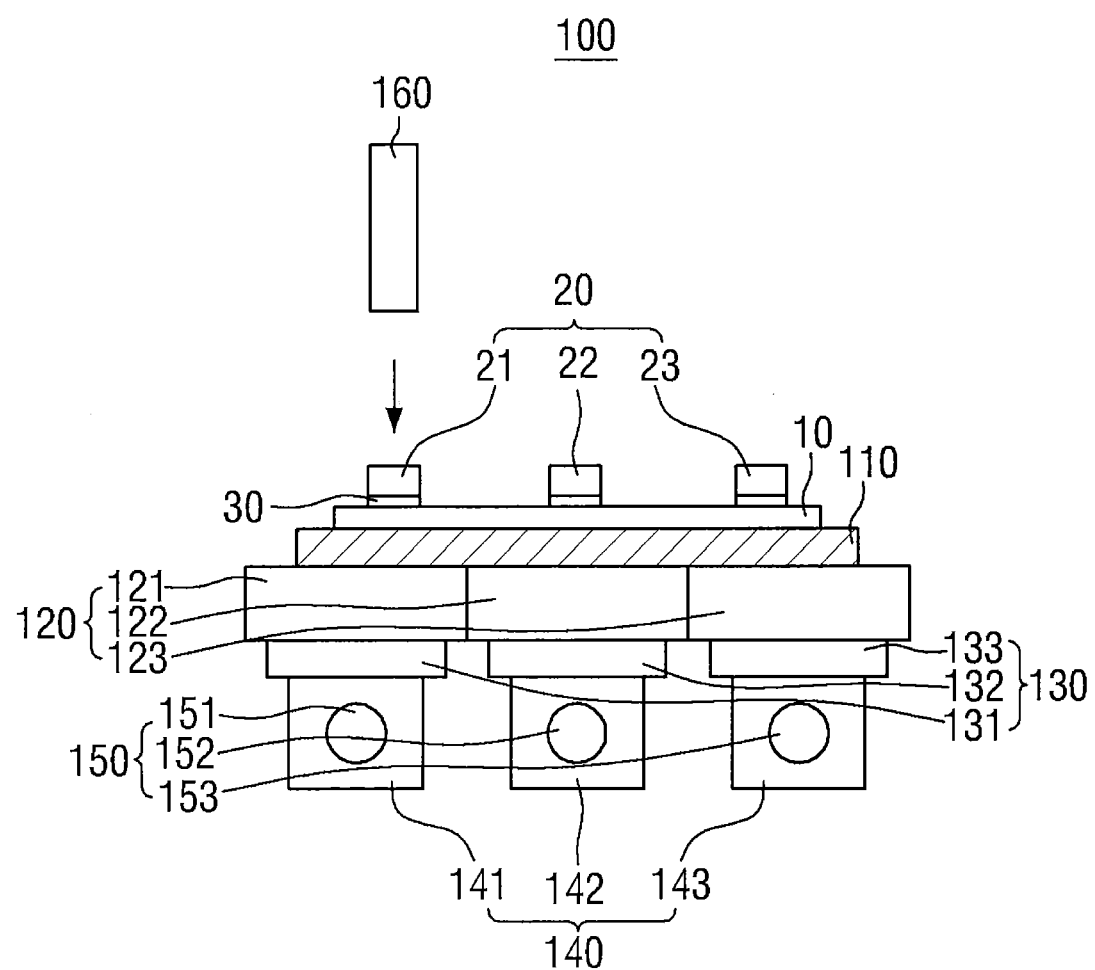
FIG. 2 is a cross-sectional view taken along the line A-A' of FIG. 1.
Figure 3:
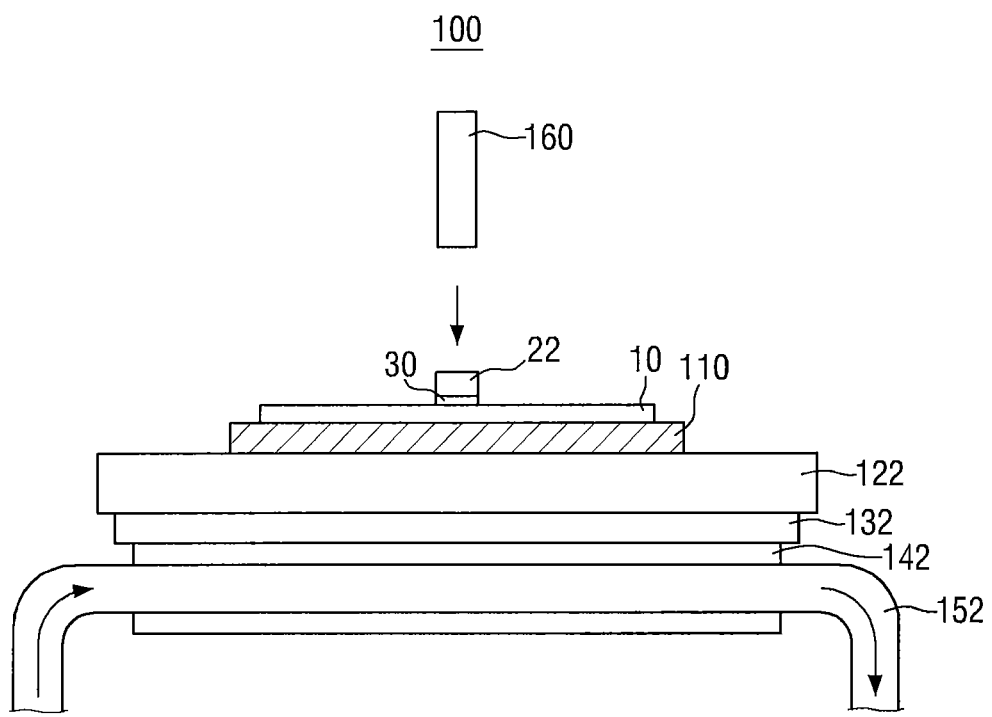
FIG. 3 is a cross-sectional view taken along the line B-B' of FIG. 1.

Hereinafter, a bonding apparatus according to an embodiment of the present inventive concept will be described with reference to FIGS. 1 to 3. FIG. 1 is a perspective view of a bonding apparatus according to an embodiment of the present inventive concept, FIG. 2 is a cross-sectional view taken along the line A-A' of FIG. 1, and FIG. 3 is a cross-sectional view taken along the line B-B' of FIG. 1.

Referring first to FIG. 1, the bonding apparatus 100 includes a bonding stage and a bonding head 160. The bonding stage includes a thin plate 110, a heater 120, an insulating unit 130, a cooler 140 and a cooling pipe 150.

A substrate 10 may be a silicon substrate based on a semiconductor wafer. In some embodiments, the substrate 10 may be a board for a package, for example, a printed circuit board (PCB).

The substrate 10 may be, for example, a bulk silicon substrate. Otherwise, the substrate 10 may be a silicon substrate or may be a substrate made of another material such as silicon germanium, indium antimonide, lead telluride, indium arsenide, indium phosphide, gallium arsenide, or gallium antimonide. Alternatively, the substrate 10 may include a base substrate and an epitaxial layer formed on the base substrate.

A plurality of semiconductor chips 20 may be formed using silicon, a silicon-on-insulator (SOI), silicon germanium, but the present inventive concept is not limited thereto.

The plurality of semiconductor chips 20 may be, for example, non-volatile memory chips. In detail, the memory chip may be a flash memory chip. In more detail, the memory Chip may be one of a NAND flash memory chip and a NOR flash memory chip.

However, semiconductor devices according to some embodiments of the present inventive concept are not limited to those disclosed herein. That is to say, in some other embodiments, the memory chip may include one selected from a phase-change random-access memory (PRAM), a magneto-resistive random-access memory (MRAM), and a resistive random-access memory (RRAM).

When the plurality of semiconductor chips 20 are non-volatile memory chips, they may be implemented into various types of semiconductor packages. For example, the plurality of semiconductor chips 20 according to an embodiment of the present inventive concept may be packaged in various forms, such as a package on package (PoP), a ball grid arrays (BGA), a chip scale packages (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline IC (SOIC), a shrink small outline package (SSOP), a thin small outline package (TSOP), a system in package (SIP), a multi chip package (MCP), a wafer-level fabricated package (WFP), or a wafer-level processed stack package (WSP).

An adhesion member 30 may be a non-conductive film (NCF). The adhesion member 30 may include, for example, at least one organic resin selected from the group including of epoxy resin, acrylic resin, polyester resin and polycarbonate.

The bonding head 160 may be disposed on the bonding stage. In detail, the bonding head 160 is disposed on the plurality of semiconductor chips 20 disposed on the bonding stage to bond the plurality of semiconductor chips 20 on the substrate 10.

The bonding head 160 may apply pressure and heat to the plurality of semiconductor chips 20. Thus, the plurality of semiconductor chips 20 may be bonded to the substrate 10 by the adhesion member 30 disposed between the substrate 10 and the plurality of semiconductor chips 20.

The heater 120 may include a first heater 121, a second heater 122 and a third heater 123, but the present inventive concept is not limited thereto. That is to say, in some other embodiments of the present inventive concept, the heater 120 may include two heaters. In addition, in some other embodiments of the present inventive concept, the heater 120 may include four or more heaters.

The heater 120 may be disposed under the substrate 10 including the plurality of semiconductor chips 20 disposed thereon. In detail, the first heater 121 may be disposed under a first region of the substrate 10. The second heater 122 may be disposed under a second region adjacent to and different from the first region of the substrate 10. The third heater 123 may be disposed under a third region different from the first and second regions and adjacent to the second region.

The first heater 121 may apply heat to the first region of the substrate 10. The first heater 121 may bond a first semiconductor chip 21 disposed on the first region of the substrate 10 to the substrate 10 using the adhesion member 30.

The second heater 122 may apply heat to the second region of the substrate 10. The second heater 122 may bond a second semiconductor chip 22 disposed on the second region of the substrate 10 to the substrate 10 using the adhesion member 30.

The third heater 123 may apply heat to a third region of the substrate 10. The third heater 123 may bond a third semiconductor chip 23 to the substrate 10 disposed on the third region of the substrate 10 using the adhesion member 30.

The first to third heaters 121, 122 and 123 may be independently operated. In some embodiments of the present inventive concept, when the first semiconductor chip 21 disposed on the first region of the substrate 10 is bonded to the substrate 10, the first heater 121 may be operated while the second and third heaters 122 and 123 may not be operated.

When the second semiconductor chip 22 disposed on the second region of the substrate 10 is bonded to the substrate 10, the second heater 122 may be operated while the first and third heaters 121 and 123 may not be operated.

When the third semiconductor chip 23 disposed on the third region of the substrate 10 is bonded to the substrate 10, the third heater 123 may be operated while the first and second heaters 121 and 122 may not be operated.

In some other embodiments of the present inventive concept, when the first semiconductor chip 21 disposed on the first region of the substrate 10 is bonded to the substrate 10, the first heater 121 may be operated and the second heater 122 may be operated before the operating of the first heater 121 is interrupted.

When the second semiconductor chip 22 disposed on the second region of the substrate 10 is bonded to the substrate 10, the first heater 121 may not be operated, the second heater 122 may be operated and the third heater 123 may be operated before the operating of the second heater 122 is interrupted.

When the third semiconductor chip 23 disposed on the third region of the substrate 10 is bonded to the substrate 10, the first and second heaters 121 and 122 may not be operated and the third heater 123 may be operated.

The heater 120 may include a ceramic having relatively higher thermal conductivity than the insulating unit 130, but the present inventive concept is not limited thereto. That is to say, in some other embodiments of the present inventive concept, the heater 120 may include a different material having relatively higher thermal conductivity than the insulating unit 130.

The thin plate 110 may be disposed on the heater 120. In detail, the thin plate 110 may be disposed between the heater 120 and the substrate 10 and may support the substrate 10.

The thin plate 110 may transfer the heat generated from the heater 120 to the substrate 10. The thin plate 110 may include a ceramic having relatively higher thermal conductivity than the insulating unit 130, but the present inventive concept is not limited thereto. That is to say, in some other embodiments of the present inventive concept, the thin plate 110 may include a different material having relatively higher thermal conductivity than the insulating unit 130.

When there are height differences between each of top surfaces of the first to third heaters 121, 122 and 123, the thin plate 110 may support the substrate 10 on the same plane, regardless of the height differences between each of the top surfaces of the first to third heaters 121, 122 and 123.

The insulating unit 130 may include a first insulating unit 131, a second insulating unit 132 and a third insulating unit 133, but the present inventive concept is not limited thereto. That is to say, in some other embodiments of the present inventive concept, the insulating unit 130 may include one or two insulating units. In addition, in some other embodiments of the present inventive concept, the insulating unit 130 may include four or more insulating units.

The insulating unit 130 may be disposed under the heater 120. In detail, the first insulating unit 131 may be disposed between the first heater 121 and a first cooler 141. The second insulating unit 132 may be disposed between the second heater 122 and a second cooler 142. The third insulating unit 133 may be disposed between the third heater 123 and a first cooler 143.

The first insulating unit 131 may reduce the heat generated from the first heater 121 and transferred to a lower portion of the bonding apparatus 100. The second insulating unit 132 may reduce the heat generated from the second heater 122 and transferred to a lower portion of the bonding apparatus 100. The third insulating unit 133 may reduce the heat generated from the third heater 123 and transferred to a lower portion of the bonding apparatus 100.

The insulating unit 130 may include a ceramic having relatively lower thermal conductivity and relatively resistant to thermal deformation than the heater 120, but the present inventive concept is not limited thereto. That is to say, in some other embodiments of the present inventive concept, the insulating unit 130 may include a different material having relatively lower thermal conductivity and relatively resistant to thermal deformation than the heater 120.

The cooler 140 may include a first cooler 141, a second cooler 142 and a third cooler 143, but the present inventive concept is not limited thereto. That is to say, in some other embodiments of the present inventive concept, the cooler 140 may include one or two coolers. In addition, in some other embodiments of the present inventive concept, the cooler 140 may include four or more coolers.

The cooler 140 may be disposed under the insulating unit 130. In detail, the first cooler 141 may be disposed under the first insulating unit 131. The second cooler 142 may be disposed under the second insulating unit 132. The third cooler 143 may be disposed under the third insulating unit 133.

The first cooler 141 may prevent the heat generated from the first heater 121 and reduced by the first insulating unit 131 from being transferred to a lower portion of the bonding apparatus 100 using the first cooling pipe 151.

The second cooler 142 may prevent the heat generated from the second heater 122 and reduced by the second insulating unit 132 from being transferred to a lower portion of the bonding apparatus 100 using the second cooling pipe 152.

The third cooler 143 may prevent the heat generated from the third heater 123 and reduced by the third insulating unit 133 from being transferred to a lower portion of the bonding apparatus 100 using the third cooling pipe 153.

When the plurality of semiconductor chips 20 are bonded to the substrate 10, the first to third coolers 141, 142 and 143 may be continuously operated.

Accordingly, the first to third coolers 141, 142 and 143 may continuously prevent the heat generated from the first to third heaters 121, 122 and 123 from being transferred to lower portions of the first to third coolers 141, 142 and 143 while the plurality of semiconductor chips 20 are bonded to the substrate 10, but the present inventive concept is not limited thereto.

That is to say, in some other embodiments of the present inventive concept, the first to third coolers 141, 142 and 143 may be operated responsive to the operating of the first to third heaters 121, 122 and 123.

The cooling pipe 150 may include a first cooling pipe 151, a second cooling pipe 152 and a third cooling pipe 153.

The cooling pipe 150 may be disposed to penetrate the inside of the cooler 140. In detail, the first cooling pipe 151 may be disposed to penetrate the first cooler 141. The second cooling pipe 152 may be disposed to penetrate the second cooler 142. The third cooling pipe 153 may be disposed to penetrate the third cooler 143.

The cooling pipe 150 illustrated in FIG. 1 penetrates and extends in a direction in which the cooler 140 extends, but the present inventive concept is not limited thereto.

A cooling fluid may be fed into the cooling pipe 150. The cooling fluid may be, for example, water or air, but the present inventive concept is not limited thereto. That is to say, in some other embodiments of the present inventive concept, the cooling fluid may be a different cooling fluid other than water or air. The cooling pipe 150 may lower a temperature of the cooler 140 using the cooling fluid fed into the cooling pipe 150.

One cooling pipe 150 disposed in each cooler 140 is illustrated in FIG. 1, but the present inventive concept is not limited thereto. That is to say, in some other embodiments of the present inventive concept, two or more cooling pipes 150 may be disposed in each cooler 140.

Hereinafter, effects of a thin plate in a bonding apparatus according to an embodiment of the present inventive concept will be described with reference to FIGS. 4 and 5.

Figure 4:
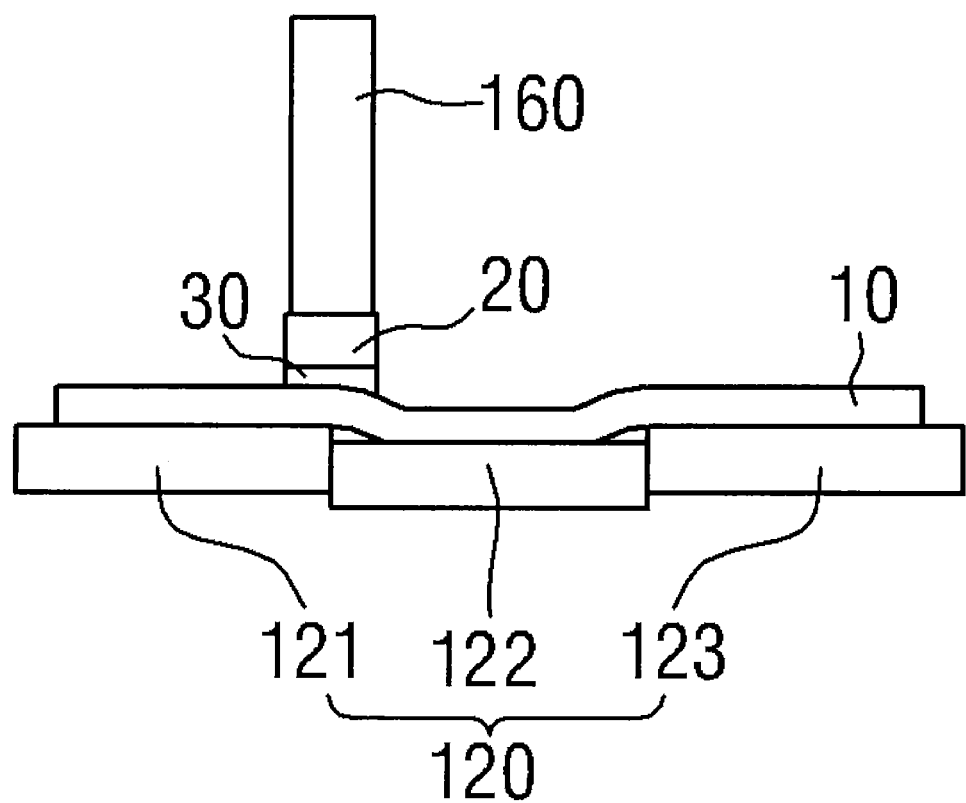
FIG. 4 is a view for explaining appearance failures generated in a bonding process of a semiconductor chip.
Figure 5:
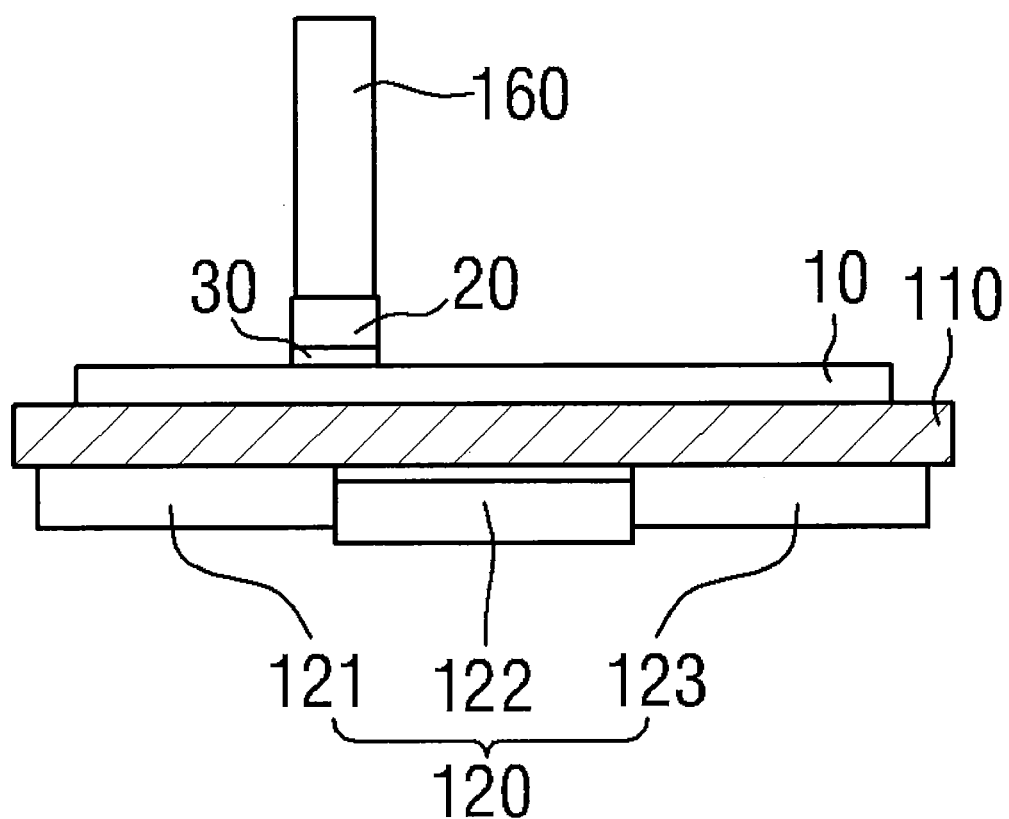
FIG. 5 is a view for explaining effects of a thin plate in a bonding apparatus according to an embodiment of the present inventive concept.

FIG. 4 is a view for explaining appearance failures generated in a bonding process of a semiconductor chip and FIG. 5 is a view for explaining effects of a thin plate in a bonding apparatus according to an embodiment of the present inventive concept.

Referring to FIG. 4, when the plurality of semiconductor chips 20 are arranged on a boundary between the first heater 121 and the second heater 122 and there is a height difference between top surfaces of the first heater 121 and the second heater 122, appearance failures may be generated when the plurality of semiconductor chips 20 are bonded.

In detail, the substrate 10 having the plurality of semiconductor chips 20 bonded thereto may be made of a flexible material. When the plurality of semiconductor chips 20 arranged on the boundary between the first heater 121 and the second heater 122 are bonded to the substrate 10, the substrate 10 may be bent along top surfaces of the first heater 121 and the second heater 122. Accordingly, the plurality of semiconductor chips 20 are bonded to the bent substrate 10, so that appearance failures may occur, as shown in FIG. 4.

Referring to FIG. 5, in the bonding apparatus 100 according to an embodiment of the present inventive concept, the thin plate 110 may be disposed between the substrate 10 and the heater 120. When there is a height difference between the top surfaces of the first heater 121 and the second heater 122, the thin plate 110 may support the substrate 10 so as not to be bent by the pressure applied from the bonding head 160.

In order to prevent the plurality of semiconductor chips 20 from being deformed during bonding of the plurality of semiconductor chips 20, the thin plate 110 may be made of a material having a relatively high strength. In addition, in order to transfer the heat generated from the heater 120 to the substrate 10, the thin plate 110 may be made of a material having relatively high thermal conductivity.

Hereinafter, operations of a bonding apparatus according to still another embodiment of the present inventive concept will be described with reference to FIG. 6.

Figure 6:
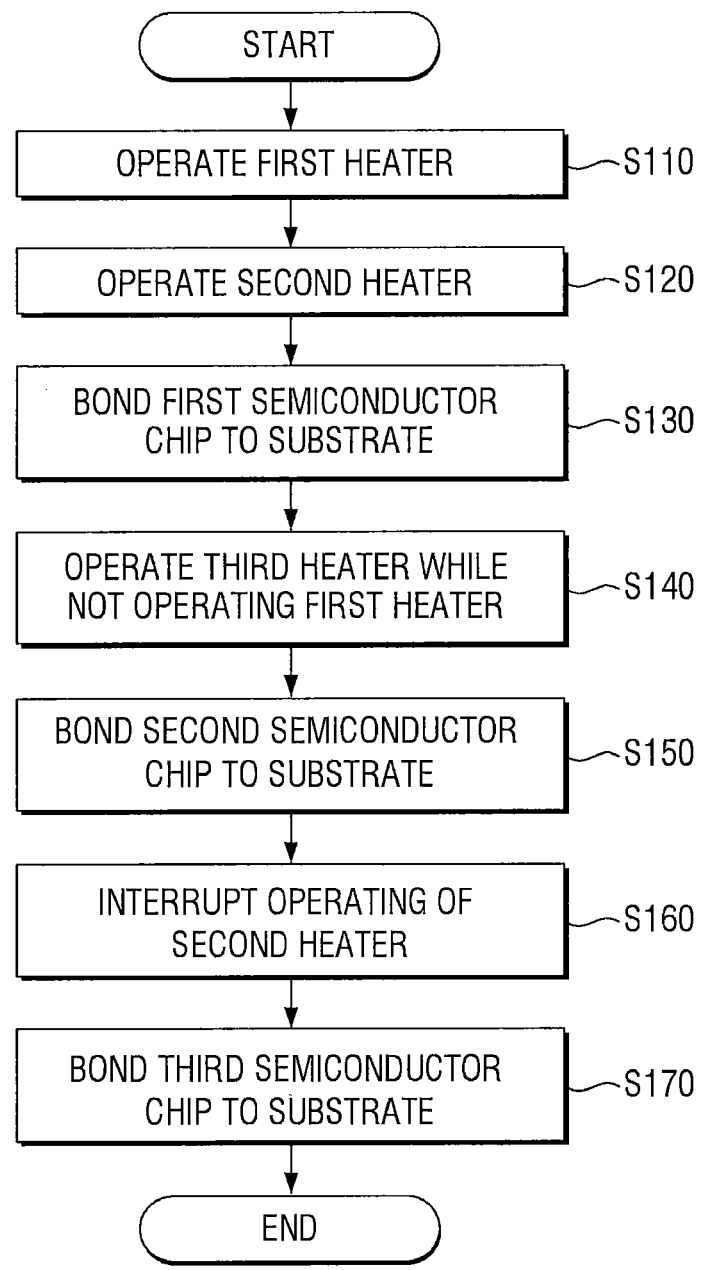
FIG. 6 is a flowchart sequentially illustrating operations of a bonding apparatus according to some embodiments of the present inventive concept.

FIG. 6 is a flowchart sequentially illustrating operations of a bonding apparatus according to some embodiments of the present inventive concept.

Referring to FIGS. 1 and 6, when the first semiconductor chip 21 is bonded to the substrate 10, the bonding head 160 is positioned on the first semiconductor chip 21. Next, the first heater 121 may be operated to transfer heat to the substrate 10 (S110).

If the substrate 10 disposed on the first heater 121 is heated to a predetermined temperature for bonding the first semiconductor chip 21, the second heater 122 may be operated before bonding the first semiconductor chip 21 to the substrate 10 (S120).

If the substrate 10 disposed on the first heater 121 is heated to a predetermined temperature, the bonding head 160 is lowered toward the first semiconductor chip 21 to apply pressure and heat to the first semiconductor chip 21, thereby bonding the first semiconductor chip 21 to the substrate 10 (S130).

If the bonding of the first semiconductor chip 21 is completed, the bonding head 160 may be positioned on the second semiconductor chip 22. In this case, the operating of the first heater 121 may be interrupted.

If the substrate 10 disposed on the second heater 122 is heated to a predetermined temperature to bond the second semiconductor chip 22, the third heater 123 may be operated before bonding the second semiconductor chip 22 to the substrate 10 (S140).

If the substrate 10 disposed on the second heater 122 is heated to a predetermined temperature, the bonding head 160 is lowered toward the second semiconductor chip 22 to apply pressure and heat to the second semiconductor chip 22, thereby bonding the second semiconductor chip 22 to the substrate 10 (S150).

If the bonding of the second semiconductor chip 22 is completed, the bonding head 160 may be positioned on the third semiconductor chip 23. In this case, the operating of the second heater 122 may be interrupted (S160).

If the substrate 10 disposed on the third heater 123 is heated to a predetermined temperature, the bonding head 160 is lowered toward the third semiconductor chip 23 to apply pressure and heat to the third semiconductor chip 23, thereby bonding the third semiconductor chip 23 to the substrate 10 (S170).

Through the above-described process, the first to third semiconductor chips 21, 22 and 23 may be sequentially bonded to the substrate 10.

Hereinafter, operations of a bonding apparatus according to still another embodiment of the present inventive concept will be described with reference to FIG. 7.

Figure 7:
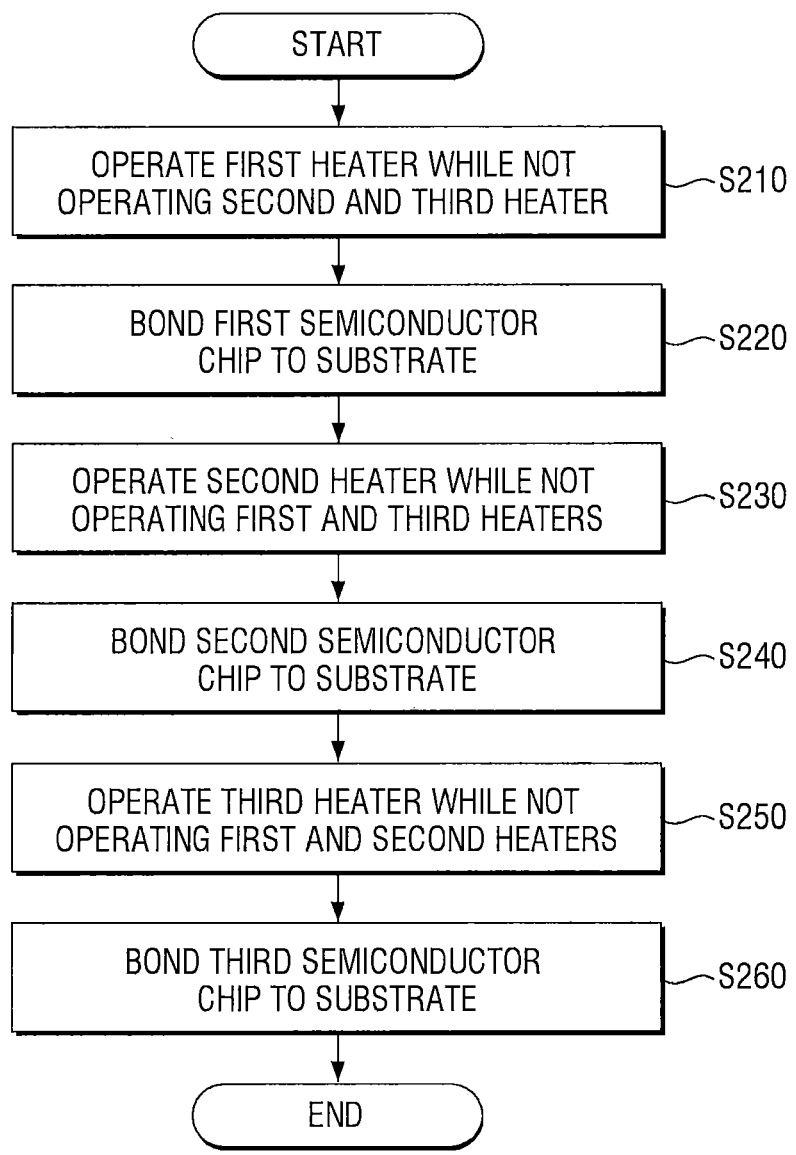
FIG. 7 is a flowchart sequentially illustrating operations of a bonding apparatus according to some other embodiments of the present inventive concept.

FIG. 7 is a flowchart sequentially illustrating operations of a bonding apparatus according to some other embodiments of the present inventive concept.

Referring to FIGS. 1 and 7, when the first semiconductor chip 21 is bonded to the substrate 10, the bonding head 160 may be positioned on the first semiconductor chip 21.

In this case, the first heater 121 may be operated, the second and third heaters 122 and 123 may not be operated and the first heater 121 may transfer heat to the substrate 10 disposed on the first heater 121 (S210).

If the substrate 10 disposed on the first heater 121 is heated to a predetermined temperature to bond the first semiconductor chip 21, the first semiconductor chip 21 may be bonded to the substrate 10 (S220).

If the bonding of the first semiconductor chip 21 is completed, the bonding head 160 may be positioned on the second semiconductor chip 22.

In this case, the second heater 122 may be operated, the first and third heaters 121 and 123 may not be operated and the second heater 122 may transfer heat to the substrate 10 disposed on the second heater 122 (S230).

If the substrate 10 disposed on the second heater 122 is heated to a predetermined temperature to bond the second semiconductor chip 22, the second semiconductor chip 22 may be bonded to the substrate 10 (S240).

If the bonding of the second semiconductor chip 22 is completed, the bonding head 160 may be positioned on the third semiconductor chip 23.

In this case, the third heater 123 may be operated, the first and second heaters 121 and 122 may not be operated and the third heater 123 may transfer heat to the substrate 10 disposed on the third heater 123 (S250).

If the substrate 10 disposed on the third heater 123 is heated to a predetermined temperature to bond the third semiconductor chip 23, the third semiconductor chip 23 may be bonded to the substrate 10 (S260).

Through the above-described process, the first to third semiconductor chips 21, 22 and 23 may be sequentially bonded to the substrate 10.

In the bonding apparatus 100 according to an embodiment of the present inventive concept, the plurality of heaters 121, 122 and 123 may be disposed under the substrate 10 and may be independently operated. Accordingly, the heater 120 may selectively transfer heat to regions of the substrate 10 having the semiconductor chips 20 being bonded.

The bonding apparatus 100 interrupts the operating of the heater 120 disposed under the semiconductor chips 20 not being bonded, thereby preventing pre-curing from occurring when the adhesion member 30 is exposed to heat for an extended period of time.

In addition, in the bonding apparatus 100 according to an embodiment of the present inventive concept, the thin plate 110 is disposed between the substrate 10 and the heater 120, thereby preventing appearance failures from occurring due to height differences between each of top surfaces of the heaters 121, 122 and 123.

Hereinafter, a bonding apparatus according to still another embodiment of the present inventive concept will be described with reference to FIG. 8. The following description will focus on differences between the bonding apparatuses shown in FIGS. 1 and 8.

Figure 8:
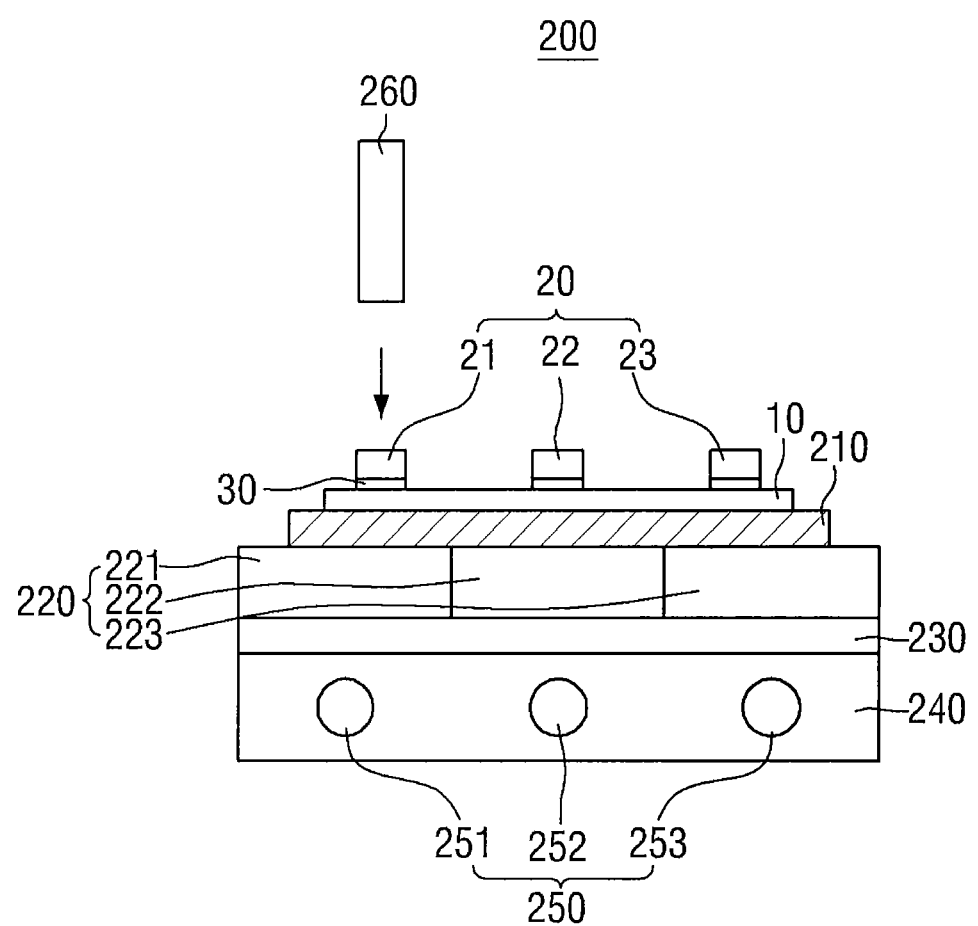
FIG. 8 is a cross-sectional view of a bonding apparatus according to another embodiment of the present inventive concept.

FIG. 8 is a cross-sectional view of a bonding apparatus according to another embodiment of the present inventive concept.

Referring to FIG. 8, the bonding apparatus 200 may include a bonding stage and a bonding head 260. The bonding stage may include a thin plate 210, a heater 220, an insulating unit 230, a cooler 240 and a cooling pipe 250.

The heater 220 may include a first heater 221, a second heater 222 and a third heater 223. The cooling pipe 250 may include a first cooling pipe 251, a second cooling pipe 252 and a third cooling pipe 253.

Unlike in the bonding apparatus 100, in the bonding apparatus 200, an insulating unit 230 may be disposed between each of the first to third heaters 221, 222 and 223 and the cooler 240. In addition, a cooler 240 may be disposed under the insulating unit 230.

The cooling pipe 250 may be disposed to penetrate the inside of the cooler 240. The cooling pipe 250 may include a first cooling pipe 251, a second cooling pipe 252 and a third cooling pipe 253.

Three cooling pipes 250 are provided in FIG. 8, but the present inventive concept is not limited thereto. That is to say, in some other embodiments of the present inventive concept, the cooler 240 may include one or two cooling pipes 250. In addition, in some other embodiments of the present inventive concept, the cooler 240 may include four or more cooling pipes 250.

Unlike in the bonding apparatus 100, in the bonding apparatus 200, one insulating unit 230 is disposed under the heater 220, thereby reducing the heat transferred from the bonding apparatus 100 to portions between each of the insulating units 131, 132 and 133.

In addition, the one and single cooler 240 is disposed under the insulating unit 230, thereby reducing the heat transferred from the bonding apparatus 100 to portions between each of the coolers 141, 142 and 143.

Hereinafter, a bonding apparatus according to still another embodiment of the present inventive concept will be described with reference to FIG. 9. The following description will focus on differences between the bonding apparatuses shown in FIGS. 1 and 9.

Figure 9:
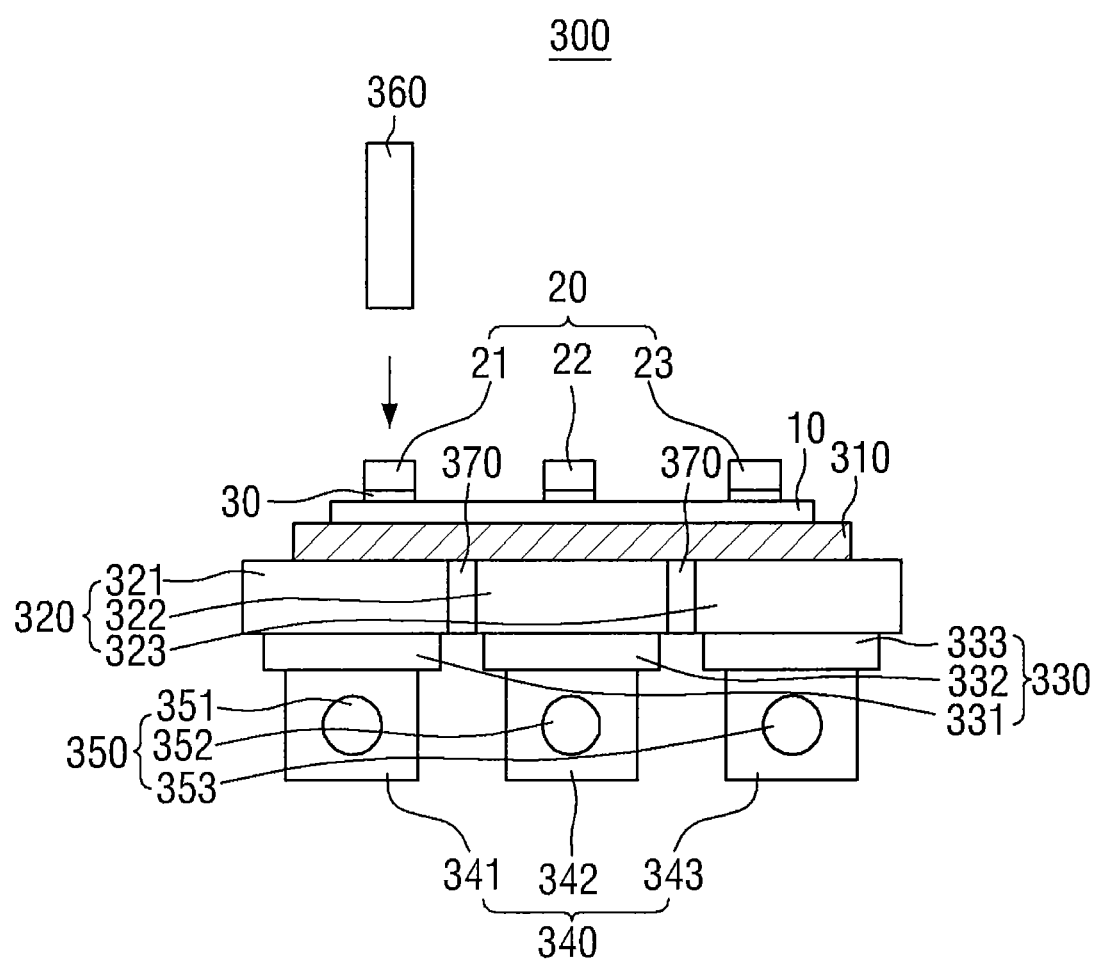
FIG. 9 is a cross-sectional view of a bonding apparatus according to still another embodiment of the present inventive concept.

FIG. 9 is a cross-sectional view of a bonding apparatus according to still another embodiment of the present inventive concept.

Referring to FIG. 9, the bonding apparatus 300 may include a bonding stage and a bonding head 360. The bonding stage may include a thin plate 310, a heater 320, an insulating unit 330, a cooler 340, a cooling pipe 350 and a heater insulating unit 370.

The heater 320 may include a first heater 321, a second heater 322 and a third heater 323. The insulating unit 330 may include a first insulating unit 331, a second insulating unit 332 and a third insulating unit 333. The cooler 340 may include a first cooler 341, a second cooler 342 and a third cooler 343. The cooling pipe 350 may include a first cooling pipe 351, a second cooling pipe 352 and a third cooling pipe 353.

Unlike the bonding apparatus 100, the bonding apparatus 300 may further include a heater insulating unit 370. In detail, the bonding apparatus 300 may be disposed between the first heater 321 and the second heater 322 and between the second heater 322 and the third heater 323.

The heater insulating unit 370 may prevent heat from being exchanged between each of the heaters 321, 322 and 323. For example, when the first heater 321 is operated and the second heater 322 adjacent to the first heater 321 is not operated, the heater insulating unit 370 may reduce the heat generated from the first heater 321 and transferred to the second heater 322.

Unlike the bonding apparatus 100, the bonding apparatus 300 prevents heat from being exchanged between each of the heaters 321, 322 and 323, thereby advantageously increasing heater efficiency in a case where the heaters 321, 322 and 323 are independently operated.

Hereinafter, a bonding apparatus according to still another embodiment of the present inventive concept will be described with reference to FIG. 10. The following description will focus on differences between the bonding apparatuses shown in FIGS. 1 and 10.

Figure 10:
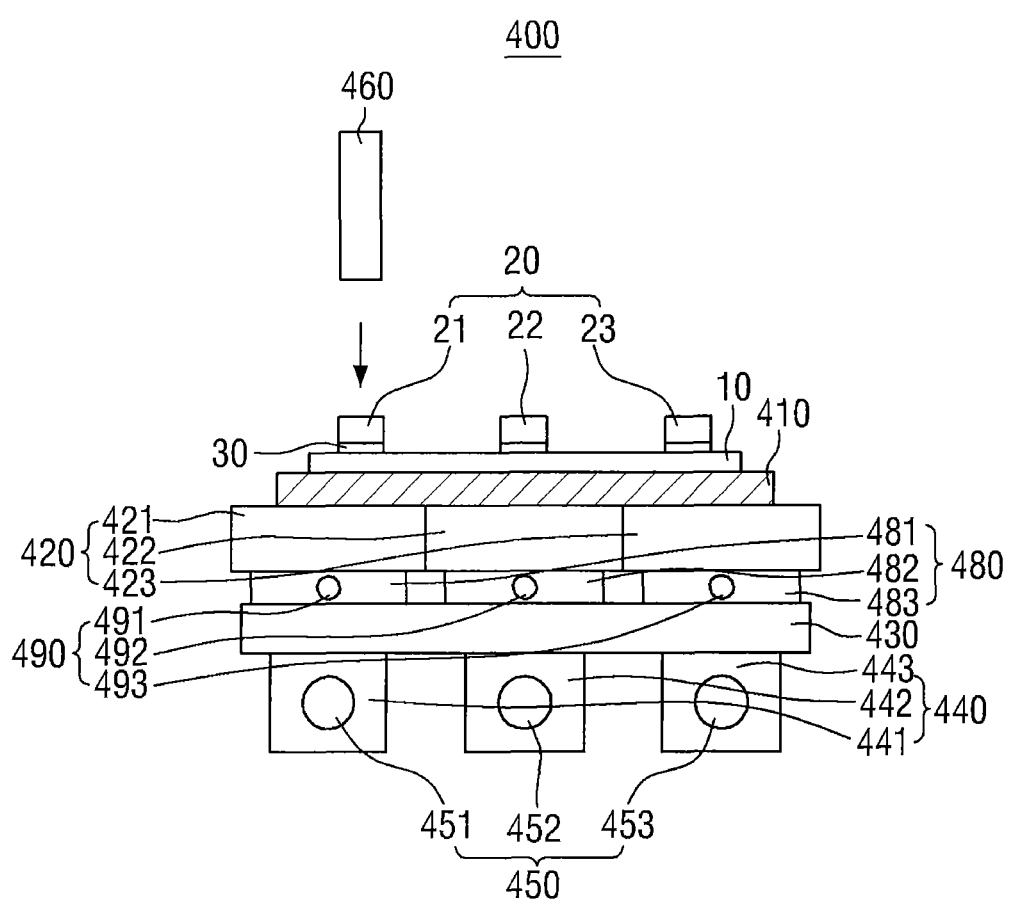
FIG. 10 is a cross-sectional view of a bonding apparatus according to still another embodiment of the present inventive concept.

FIG. 10 is a cross-sectional view of a bonding apparatus according to still another embodiment of the present inventive concept.

Referring to FIG. 10, the bonding apparatus 400 may include a bonding stage and a bonding head 460. The bonding stage may include a thin plate 410, a heater 420, an insulating unit 430, a cooler 440, a cooling pipe 450, a heater cooler 480 and a heater cooling pipe 490.

The heater 420 may include a first heater 421, a second heater 422 and a third heater 423. The cooler 440 may include a first cooler 441, a second cooler 442 and a third cooler 443. The cooling pipe 450 may include a first cooling pipe 451, a second cooling pipe 452 and a third cooling pipe 453.

Unlike the bonding apparatus 100, the bonding apparatus 300 may further include a heater cooler 480 and a heater cooling pipe 490. In addition, an insulating unit 430 may be disposed between the heater cooler 480 and the cooler 440.

The heater cooler 480 may include a first heater cooler 481, a second heater cooler 482 and a third heater cooler 483.

The heater cooler 480 may be disposed between the heater 420 and the insulating unit 430. In detail, the first heater cooler 481 may be disposed between the first heater 421 and the insulating unit 430. The second heater cooler 482 may be disposed between the second heater 422 and the insulating unit 430. The third heater cooler 483 may be disposed between the third heater 423 and the insulating unit 430, but the present inventive concept is not limited thereto.

That is to say, in some other embodiments of the present inventive concept, the one and single heater cooler 480 may be disposed between the heater 420 and the insulating unit 430.

If the operating of the first heater 421 is interrupted, the first heater cooler 481 may cool the first heater 421 using the first heater cooling pipe 491. If the operating of the second heater 422 is interrupted, the second heater cooler 482 may cool the second heater 422 using the second heater cooling pipe 492. If the operating of the third heater 423 is interrupted, the third heater cooler 483 may cool the third heater 423 using the third heater cooling pipe 493.

The first to third heater coolers 481, 482 and 483 may be independently operated. In detail, the first to third heater coolers 481, 482 and 483 may be individually operated when the operating of the first to third heaters 421, 422 and 423 is interrupted.

The heater cooling pipe 490 may include a first heater cooling pipe 491, a second heater cooling pipe 492 and a third heater cooling pipe 493.

The heater cooling pipe 490 may be disposed to penetrate the inside of the heater cooler 480. In detail, the first heater cooling pipe 491 may be disposed to penetrate the first heater cooler 481. The second heater cooling pipe 492 may be disposed to penetrate the second heater cooler 482. The third heater cooling pipe 493 may be disposed to penetrate the third heater cooler 483.

The heater cooling pipe 490 penetrating and extending in a direction in which the heater cooler 480 extends is illustrated in FIG. 10, but the present inventive concept is not limited thereto.

A cooling fluid may be fed into the heater cooling pipe 490. The cooling fluid may be, for example, water or air, but the present inventive concept is not limited thereto. That is to say, in some other embodiments of the present inventive concept, the cooling fluid may be a different cooling fluid other than water or air. The heater cooling pipe 490 may lower a temperature of the heater cooler 480 using the cooling fluid fed into the heater cooling pipe 490.

The one and single heater cooling pipe 490 disposed in each heater cooler 480 is illustrated in FIG. 10, but the present inventive concept is not limited thereto. That is to say, in some other embodiments of the present inventive concept, two or more heater cooling pipes 490 may be disposed in each heater cooler 480.

Unlike the bonding apparatus 100, the bonding apparatus 400 may include the heater cooling units 481, 482 and 483 disposed between each of the heaters 421, 422 and 423 and the insulating unit 430 to cool the heaters 421, 422 and 423, thereby rapidly cooling the heaters 421, 422 and 423 interrupted in operating.

In addition, the bonding apparatus 400 may include the heater cooling pipes 491, 492 and 493 penetrating the heater cooling units 481, 482 and 483, thereby lowering temperatures of the heater cooling units 481, 482 and 483.

Hereinafter, a bonding apparatus according to still another embodiment of the present inventive concept will be described with reference to FIG. 11. The following description will focus on differences between the bonding apparatuses shown in FIGS. 10 and 11.

Figure 11:
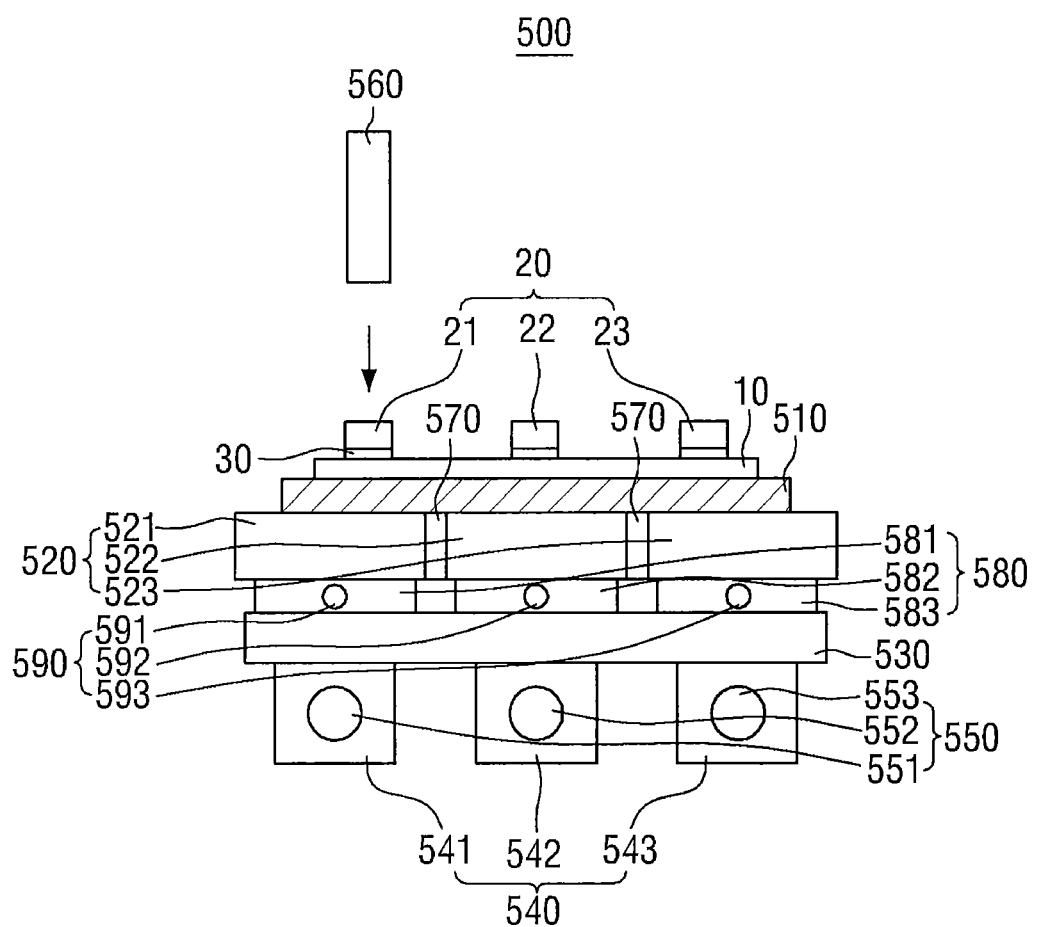
FIG. 11 is a cross-sectional view of a bonding apparatus according to still another embodiment of the present inventive concept.

FIG. 11 is a cross-sectional view of a bonding apparatus according to still another embodiment of the present inventive concept.

Referring to FIG. 11, the bonding apparatus 500 may include a bonding stage and a bonding head 560. The bonding stage may include a thin plate 510, a heater 520, an insulating unit 530, a cooler 540, a cooling pipe 550, a heater insulating unit 570, a heater cooler 580 and a heater cooling pipe 590.

The heater 520 may include a first heater 521, a second heater 522 and a third heater 523. The cooler 540 may include a first cooler 541, a second cooler 542 and a third cooler 543. The cooling pipe 550 may include a first cooling pipe 551, a second cooling pipe 552 and a third cooling pipe 553. The heater cooler 580 may include a first heater cooler 581, a second heater cooler 582 and a third heater cooler 583. The heater cooling pipe 590 may include a first heater cooling pipe 591, a second heater cooling pipe 592 and a third heater cooling pipe 593.

Unlike the bonding apparatus 400, the bonding apparatus 500 may further include a heater insulating unit 570. In detail, the bonding apparatus 500 may be disposed between the first heater 521 and the second heater 522 and between the second heater 522 and the third heater 523.

The heater insulating unit 570 may prevent the heat from being exchanged between each of the heaters 521, 522 and 523. For example, when the first heater 521 is operated and the second heater 522 adjacent to the first heater 521 is not operated, the heater insulating unit 570 may reduce the heat generated from the first heater 521 and transferred to the second heater 522.

Unlike the bonding apparatus 400, the bonding apparatus 500 may prevent the heat from being exchanged between each of the heaters 521, 522 and 523, thereby advantageously increasing heater efficiency in a case where the heaters 521, 522 and 523 are independently operated.

Hereinafter, an electronic system including semiconductor devices fabricated using bonding apparatuses according to exemplary embodiments of the present general inventive concept will be described with reference to FIG. 12.

Figure 12:
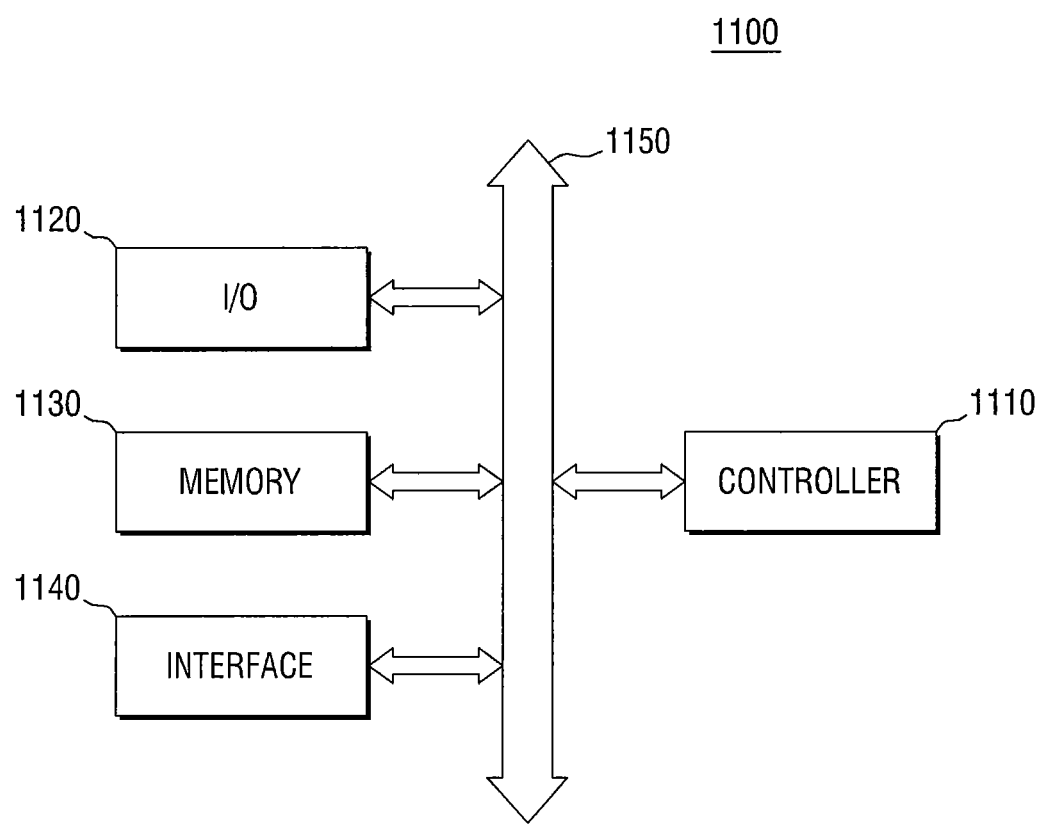
FIG. 12 is a block diagram of an electronic system including semiconductor devices fabricated using bonding apparatuses according to exemplary embodiments of the present general inventive concept.

FIG. 12 is a block diagram of an electronic system including semiconductor devices fabricated using bonding apparatuses according to embodiments of the present general inventive concept.

Referring to FIG. 12, the electronic system 1100 according to embodiments of the inventive concept may include a controller 1110, an input/output (I/O) unit 1120, a memory device 1130, an interface unit 1140 and a bus 1150.

The controller 1110, the I/O unit 1120, the memory device 1130 and the interface unit 1140 may communicate with each other through the bus 1150. The bus 1150 may correspond to a path through which electrical signals are transmitted.

The controller 1110 may include at least one of a microprocessor, a digital signal processor, a microcontroller or another logic device capable of performing a similar function to any one of the microprocessor, the digital signal processor and the microcontroller.

The I/O unit 1120 may include a keypad, a keyboard and/or a display unit. The memory device 1130 may store data and/or commands.

The interface unit 1140 may transmit electrical data to a communication network or may receive electrical data from a communication network. The interface unit 1140 may operate in a wired or wireless manner. For example, the interface unit 1140 may include an antenna or a wired/wireless transceiver. Alternatively, the electronic system 1100 may further include a high-speed dynamic random access memory (DRAM) device and/or a high-speed static random access memory (SRAM) device which acts as a working memory for improving an operation of the controller 1110. The semiconductor devices according to the embodiments described above may be incorporated into the memory device 1130 or may be provided as at least one of the controller 1110 and the I/O unit 1120.

The electronic system 1100 may be applied to a personal digital assistant (PDA), a portable computer, a web tablet, a wireless phone, a mobile phone, a digital music player, a memory card or any type of electronic device capable of transmitting and/or receiving information in a wireless environment.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A bonding stage, comprising:
a first heater;
a second heater adjacent the first heater;
a cooler disposed under the first and second heaters, wherein the cooler comprises a first cooler disposed under the first heater and a second cooler disposed under the second heater, wherein the first cooler comprises a first cooling pipe penetrating an inside of the first cooler, wherein the second cooler comprises a second cooling pipe penetrating an inside of the second cooler, wherein a temperature of the first cooler is lowered via a cooling fluid induced through the first cooling pipe, and wherein a temperature of the second cooler is lowered via a cooling fluid induced through the second cooling pipe, and wherein the cooler is configured to block heat transfer from the first heater and heat transfer from the second heater to lower portions of the first and second heaters; and
a plate disposed on the first heater and the second heater, wherein the thin plate is configured to support a substrate having a plurality of semiconductor chips disposed thereon, and wherein the plate transfers heat from the first and second heaters to the substrate,
wherein the first and second heaters are independently operated.

2. The bonding stage of claim 1, further comprising:
a first insulating unit disposed between the first heater and the cooler, wherein the first insulating unit is configured to reduce heat transfer from the first heater to the cooler; and
a second insulating unit disposed between the second heater and the cooler, wherein the second insulating unit is configured to reduce heat transfer from the second heater to the cooler.

3. The bonding stage of claim 2, wherein the first and second insulating units each comprise ceramic material.

4. The bonding stage of claim 1, further comprising a heater insulating unit disposed between the first heater and the second heater that is configured to reduce heat exchange between the first heater and the second heater.

5. The bonding stage of claim 1, wherein the plate comprises a ceramic material.

6. The bonding stage of claim 1, wherein the first heater is configured to be operated while the second heater is not operated, and wherein the second heater is configured to be operated while the first heater is not operated.

7. A bonding apparatus comprising:
a bonding head configured to apply pressure and heat to a plurality of semiconductor chips disposed on a substrate;
a first heater disposed under a first region of the substrate;
a second heater disposed under a second region different from the first region of the substrate;
a cooler disposed under the first and second heaters, wherein the cooler is configured to block heat transfer from the first heater and heat transfer from the second heater to lower portions of the first and second heaters;
a heater cooler disposed between the first and second heaters and the cooler, wherein the heater cooler is configured to cool the first heater and the second heater; and
a plate disposed on the first heater and the second heater, wherein the plate supports the substrate and transfers heat from the first and second heaters to the substrate;
wherein when the bonding head is positioned at the first heater, the second heater is configured to start operating before operation of the first heater is interrupted, and when the bonding head is moved to the second heater, operation of the first heater is interrupted.

8. The bonding apparatus of claim 7, further comprising an insulating unit disposed between the heater cooler and the cooler, wherein the insulating unit is configured to reduce heat transfer from the first and second heaters to the cooler.

9. The bonding apparatus of claim 8, wherein the heater cooler comprises:
a first heater cooler disposed between the first heater and the insulating unit, wherein the first heater cooler is configured to cool the first heater; and a second heater cooler disposed between the second heater and the insulating unit, wherein the second heater cooler is configured to cool the second heater.

10. The bonding apparatus of claim 9, wherein the first heater cooler comprises a first heater cooling pipe penetrating an inside of the first heater cooler, wherein the second heater cooler comprises a second heater cooling pipe penetrating an inside of the second heater cooler, wherein a temperature of the first heater cooler is lowered via a cooling fluid induced through the first heater cooling pipe, and wherein a temperature of the second heater cooler is lowered via a cooling fluid induced through the second heater cooling pipe.

11. The bonding apparatus of claim 9, wherein the first heater and the first heater cooler are configured to be operated independently of the second heater and the second heater cooler.

12. The bonding apparatus of claim 7, wherein the first and second heaters each comprise a ceramic material.

13. A bonding apparatus, comprising:
 a bonding stage that supports a substrate, wherein the bonding stage comprises:
  a first heater;
  a second heater adjacent the first heater;
  a plate disposed on the first and second heaters, wherein the plate supports the substrate having a plurality of semiconductor chips disposed thereon, and wherein the plate transfers heat from the first and second heaters to the substrate;
  a cooler disposed under the first and second heaters, wherein the cooler blocks heat transfer from the first and second heaters to lower portions of the first and second heaters;
  a first insulating unit disposed between the first heater and the cooler, wherein the first insulating unit is configured to reduce heat transfer from the first heater to the cooler; and
  a second insulating unit disposed between the second heater and the cooler, wherein the second insulating unit is configured to reduce heat transfer from the second heater to the cooler; and
 a bonding head operatively associated with the bonding stage, wherein the bonding head is configured to apply pressure and heat to each of the plurality of semiconductor chips disposed on the substrate.

14. The bonding apparatus of claim 13, wherein the first and second heaters are independently operated.

15. The bonding apparatus of claim 13, wherein the cooler comprises:
 a first cooler disposed under the first heater, wherein the first cooler comprises a first cooling pipe, and wherein a temperature of the first cooler is lowered via a cooling fluid induced through the first cooling pipe; and
 a second cooler disposed under the first heater, wherein the second cooler comprises a second cooling pipe, and wherein a temperature of the second cooler is lowered via a cooling fluid induced through the second cooling pipe.

16. The bonding apparatus of claim 13, wherein the first and second insulating units comprise ceramic material having a first thermal conductivity, and wherein the plate comprises a ceramic material having a second thermal conductivity that is higher than the first thermal conductivity.

* * * * *